United States Patent
Kohler

(10) Patent No.: US 12,359,905 B2
(45) Date of Patent: Jul. 15, 2025

(54) FILTERING FOR CO-SENSOR FUSION IN ATOMIC SENSORS

(71) Applicant: Vector Atomic, Inc., Pleasanton, CA (US)

(72) Inventor: Jonathan Lynn Kohler, Pleasanton, CA (US)

(73) Assignee: Vector Atomic, Inc., Pleasanton, CA (US)

( * ) Notice: Subject to any disclaimer, the term of this patent is extended or adjusted under 35 U.S.C. 154(b) by 280 days.

(21) Appl. No.: 17/936,994

(22) Filed: Sep. 30, 2022

(65) Prior Publication Data

US 2024/0125587 A1    Apr. 18, 2024

(51) Int. Cl.

| | |
|---|---|
| G01B 9/02001 | (2022.01) |
| G01B 9/02 | (2022.01) |
| G01B 9/02055 | (2022.01) |
| G01C 19/58 | (2006.01) |
| G01P 15/08 | (2006.01) |
| G01V 7/06 | (2006.01) |
| G01V 13/00 | (2006.01) |
| G04F 5/14 | (2006.01) |
| H03H 17/06 | (2006.01) |
| H05H 3/02 | (2006.01) |
| G01P 21/00 | (2006.01) |

(52) U.S. Cl.
CPC ..... *G01B 9/02001* (2013.01); *G01B 9/02041* (2013.01); *G01B 9/02049* (2013.01); *G01B 9/02055* (2013.01); *G01B 9/0207* (2013.01); *G01B 9/02083* (2013.01); *G01C 19/58* (2013.01); *G01P 15/08* (2013.01); *G01V 7/06* (2013.01); *G01V 13/00* (2013.01); *G04F 5/14* (2013.01); *H03H 17/06* (2013.01); *H05H 3/02* (2013.01); *G01P 21/00* (2013.01)

(58) Field of Classification Search
CPC ............ G01B 9/02001; G01B 9/02041; G01B 9/02049; G01B 9/02055; G01B 9/0207; G01B 9/02083; G01V 7/06; G01V 13/00; H03H 17/06; H05H 3/02
See application file for complete search history.

(56) References Cited

FOREIGN PATENT DOCUMENTS

CN    114527520 A    5/2022

OTHER PUBLICATIONS

European Patent Office, Extended European Search Report for European Patent Application No. 23197368.6, dated Apr. 25, 2024.
Le Gouet et al: "Limits to the sensitivity of a low noise compact atomic gravimeter", Applied Physics B ; Lasers and Optics, Springer, Berlin, DE, vol. 92, No. 2, Jun. 27, 2008 (Jun. 27, 2008), pp. 133-144.
Teo Yik R et al: "A new repetitive control scheme based on non-causal FIR filters", 2015 American Control Conference (ACC), IEEE, Jun. 4, 2014 (Jun. 4, 2014), pp. 991-996.

(Continued)

*Primary Examiner* — Benjamin R Schmitt
(74) *Attorney, Agent, or Firm* — Patterson + Sheridan, LLP

(57) ABSTRACT

A matched filter in a measurement device that includes an atomic sensor with a co-sensor is described. In one embodiment, the matched filter is a non-causal filter. Embodiments herein also describe a method for producing a matched filter by determining a filter transfer function from the transfer functions of the atomic sensor and the co-sensor. The method can be used to produce a matched filter that is non-causal but can also generate a causal filter for time sensitive applications.

19 Claims, 8 Drawing Sheets

(56) References Cited

OTHER PUBLICATIONS

John Kitching et al: "Atomic Sensors—A Review", IEEE Sensors Journal, IEEE, USA, vol. 11, No. 9, Sep. 2011 (Sep. 2011), pp. 1749-1758.

"Zero-Dead-Time Operation of Interleaved Atomic Clocks," G. Biedermann et al. Phys. Rev. Lett. 111, 170802 (2013). [Abstract Only].

"Metrology with Atom Interferometry: Inertial Sensors from Laboratory to Field Applications," B. Fang et al. J. Phys.: Conf. Ser. 723 012049 (2016).

Merlet et al., "Operating an atom interferometer beyond its linear range," dated: Jun. 1, 2008, pp. 1-20.

"Limits to the sensitivity of a low noise compact atomic gravimeter," Appl. Phys. B 92, 133-144, (2008).

"Hybridizing matter-wave and classical accelerometers," Lautier et al, Appl. Phys. Lett. 105, (2014).

Extraction of Signals from Noise, Wainstein and Zubakov, (Dover, New York, 1970).

"Analysis of LIGO data for gravitational waves from binary neutron stars." Abbott et al, Phys. Rev. D 69, 122001 (2004).

"Entangling Mechanical Motion with Microwave Fields," Palomaki et al, Science. 342, 710 (2013).

"Simultaneous retrodiction of multimode optomechanical systems using matched filters," Kohler et al, Phys. Rev. A 101, 023804 (2020).

FILTERING FOR CO-SENSOR FUSION IN ATOMIC SENSORS

STATEMENT OF GOVERNMENT INTEREST

This invention was made with government support under Contract No: N00014-19-C-1065 awarded by the Office of Naval Research. The government has certain rights in the invention.

BACKGROUND

Field

Embodiments of the present invention generally relate to filters in measurement devices that fuse an atomic sensor with a non-atomic co-sensor.

Description of the Related Art

Many atomic quantum sensors, such as optical clocks and atom interferometry-based sensors such as accelerometers, gravimeters, and gyroscopes, are based on the generation and measurement of cold clouds of atoms, which do not provide a continuous measurement. Atomic quantum sensors that use cold atomic sensors experience downtime (e.g., time when measurements are not occurring) when the atoms are being trapped, cooled, and prepared for a measurement. Such pulsed measurements suffer from complexity of high frequency local oscillator phase or acceleration noise down to lower frequencies, yielding longer integration times to reach a desired measurement precision.

One known solution to mitigate the negative effects of downtime is to use multiple, interleaved atomic sensors where one atomic sensor is interrogated while the other is being prepared for a measurement. However, a dual atomic sensor system increases hardware complexity, has limited dynamic range, and has increased risk of failure. Another solution is sensor fusion where a co-sensor, which is not an atomic sensor, is combined with an atomic sensor. This approach combines the long-term accuracy and precision of atomic measurements with the short-term performance of a more conventional sensor, circumventing the dynamic range and aliasing problems associated with other solutions. However, these hybrid solutions previously have not fully accounted for the different spectral responses of the atomic sensor and conventional co-sensor, and therefore do not provide optimal rejection of high-frequency environmental noise (e.g., vibration on moving platforms like boats, planes, vehicles) that can introduce significant noise in the combined measurement.

SUMMARY

One embodiment described herein is a measurement device that includes an atomic sensor, a non-atomic co-sensor, and a non-causal filter coupled to an output of the co-sensor and configured to generate a filtered output. Moreover, the measurement device is configured to mitigate a noise component in an output of the atomic sensor based on the filtered output of the non-causal filter.

Another embodiment described herein is a method that includes receiving a noise signal at an atomic sensor and a non-atomic co-sensor, filtering an output of the co-sensor using a non-causal filter, and mitigating an effect of the noise signal on an output of the atomic sensor using an output of the non-causal filter.

Another embodiment described herein is a method that includes determining a transfer function of an atomic sensor, determining a transfer function of a non-atomic co-sensor where the atomic sensor and the non-atomic co-sensor are part of a measurement device, determining a filter transfer function based on the transfer functions of the atomic sensor and the co-sensor, and producing a matched filter for the measurement device based on the filter transfer function.

Another embodiment described herein is a method that includes acquiring a training dataset using an atomic sensor and a non-atomic co-sensor in a measurement device, determining a co-sensor prediction for each atomic measurement in the training dataset, determining a root-mean-square (RMS) residual between measurement predictions determined from the co-sensor and measurements obtained from the atomic sensor, and performing numerical optimization to minimize the RMS residual to produce a matched filter for the measurement device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein describe using a matched filter in a measurement device that includes an atomic sensor with a co-sensor to compensate for a frequency dependent co-sensor response. As mentioned above, prior solutions perform sensor fusion by combining an atomic sensor with a non-atomic co-sensor. However, these solutions do not optimally account for the frequency dependent response of the co-sensor to the noise introduced into the system. That is, one advantage of using the co-sensor is that its output can be used to compensate for environmental noise experienced by both the atomic sensor and co-sensor. However, the response of the co-sensor to the noise signal is frequency dependent. As such, the embodiments herein describe a matched filter that is optimally tuned to the amplitude and phase response of the co-sensor to compensate for attenuation and phase shifts at each frequency and provide an optimal correction for the atomic measurement.

Because of the frequency dependence of the co-sensor response, in one embodiment, the matched filter is a non-causal filter. Due to constraints from causality, the frequency dependence of the co-sensor response results in an inherent signal delay of the co-sensor output. This signal delay means that, to generate optimal results, post correction is used (rather than real-time correction) since measurements generated by the atomic sensor at time A are corrected using measurements generated by the co-sensor at later time B. Because the output of the optimal matched filter at time A may depend on future co-sensor measurements, the matched filter is non-causal.

However, the embodiments herein can also be used to generate a matched filter that is causal, in which case, corrections for measurements generated by the atomic sensor can be produced in real time. That is, causality can be a constraint used when designing the matched filter so that a real-time correction for the atomic measurement is produced, which does not depend on future co-sensor output. A causal matched filter may not result in the best correction signal when compared to a non-causal matched filter, but some systems may prefer a real-time corrected measurement rather than having to wait for post correction using a non-causal filter.

Figure 1:
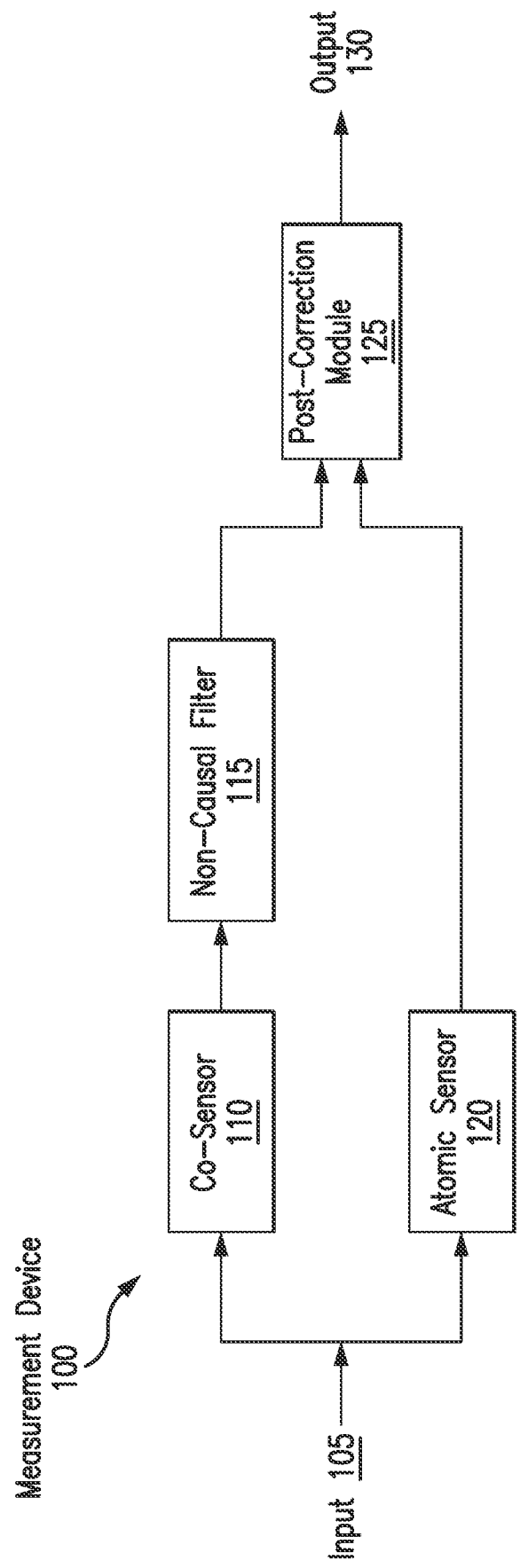
FIG. 1 illustrates a measurement device with an atomic sensor, a co-sensor, and a non-causal filter, according to one embodiment.

FIG. 1 illustrates a measurement device 100 with an atomic sensor 120, a co-sensor 110, and a non-causal filter 115, according to one embodiment. The measurement device 100 can be an accelerometer, gravimeter, or gyroscope. In general, the embodiments herein can also be used in devices that measure acceleration, rotation, magnetic fields, or electric fields using an atomic sensor 120 and a co-sensor 110. Thus, while embodiments herein often describe using the measurement device 100 as a gravimeter, this is just one example.

The atomic sensor 120 can be any atomic quantum sensor that measures acceleration, rotation, magnetic fields, or electric fields. In one embodiment, the atomic sensor 120 is a cold atom sensor that relies on capturing measurements using cold atoms (e.g., atoms that have been cooled to temperatures less than one Kelvin, and in some embodiments temperatures around a couple of micro-Kelvins). For a gravimeter, the atomic sensor 120 may trap a cluster of atoms into an atom cloud, cool the atoms to a few micro-Kelvins, and then drop the atom cloud. The atomic sensor 120 can then measure the rate at which the atom cloud falls to determine its acceleration which provides a very accurate local measurement of gravity.

However, cold atom sensors have downtime when measurements are not occurring (e.g., the acceleration of the atom cloud is not being measured) because the next atom cloud is being prepared and cooled. Such pulsed (or intermittent) measurements suffer from aliasing of high frequency local oscillator phase or acceleration noise down to lower frequencies, yielding longer integration times to reach a desired measurement precision. These problems become worse when the measurement device 100 is used in environments other than in a controlled lab such as on a moving platform (e.g., a boat, submarine, ground vehicle, or aircraft). These moving platform can inject more noise into the system from, e.g., engines, machinery, turbulence, seismic activity, and the like. This environment noise can be part of the input 105. For example, for a gravimeter, the input 105 can include the gravitational forces at the location of the measurement device 100, but can also include any noise (e.g., vibration or motion) due to other sources such as engines, machinery, turbulence, etc. Without correction, the output of the atomic sensor 120, which is intended to be a measurement of gravity, will also be affected by the noise, thereby limiting the precision of the gravity measurement.

The co-sensor 110 (e.g., a non-atomic sensor) can output a signal to mitigate or remove the noise from the output generated by the atomic sensor 120. The co-sensor 110 may be micro-electromechanical system (MEMS) accelerometer, force balance accelerometer, seismometer, or some other type of inertial sensor. In general, the type of co-sensor 110 may be selected in response to the type of noise in the environment.

Further, because the co-sensor 110 is not a cold atom sensor, it may continuously generate a noise measurement. That is, the co-sensor 110 may not have downtime like the atomic sensor 120.

As shown, the co-sensor 110 measures the same input 105 as the atomic sensor 120. Thus, any environmental noise will affect both the measurements generated by the atomic sensor 120 as well as the co-sensor 110. Stated differently, while the atomic sensor 120 is tasked with measuring a particular signal (acceleration, rotation, etc.), the co-sensor 110 is tasked primarily with measuring a continuous record of the environmental noise, and, in some realizations, to fill in the atomic sensor measurement dead-time. Any noise that is part of the input 105 is detected by both the co-sensor 110 and the atomic sensor 120.

The output of the co-sensor 110, which is a measure of noise affecting the device 100, is transmitted to a non-causal filter 115. As discussed above, the co-sensor 110 may have a frequency dependent response, where the co-sensor has a varying amplitude and phase response to different frequency components of the noise in the input 105. For any realistic co-sensor, this frequency dependent response inherently causes a delay of the co-sensor 110 output corresponding to environmental noise in the input. The non-causal filter 115 is a filter that depends on future inputs, as well as present and past inputs. That is, the output of the non-casual filter 115 at any given time depends on inputs to the filter 115 at a future. Put differently, for the non-causal filter 115 to generate an output correction for Time A, it may first have to receive an input at a later Time B. In this manner, the non-causal filter 115 can consider past, present, and future inputs received from the co-sensor 110 when generating its output corrections.

The outputs of the non-causal filter 115 and the atomic sensor 120 are received at a post correction module 125 which can be hardware, software, or a combination of both. The post correction module 125 uses the filtered output of the co-sensor 110 received from the non-causal filter 115 to perform post-correction on the outputs of the atomic sensor 120 to mitigate or remove the effects of environment noise from the atomic sensor 120.

In the measurement device 100, the post correction module 125 can use current outputs of the non-causal filter 115 to correct past outputs of the atomic sensor 120. As discussed, the non-causal filter 115 relies on future inputs in order to generate its outputs. Thus, the outputs of the non-causal filter 115 are received at the post correction module 125 with a delay relative to the outputs received from the atomic sensor 120. For example, at Time A, the co-sensor 110 and the atomic sensor 120 may provide an output (e.g., a measurement) to the non-causal filter 115 and the post correction module 125, respectively. However, the non-causal filter 115 may have to wait until Time B before receiving an additional input (or inputs) from the co-sensor 110 (due to the signal delay of the co-sensor 110) until the filter 115 outputs a filtered output corresponding to the measurement generated by the co-sensor 110 at Time A. After receiving this filtered output at Time B, the post correction module 125 can then use the filtered output to correct the output received at Time A from the atomic sensor 120. Thus, there is a delay between the post correction module 125 receiving the output of the atomic sensor 120 and when the module 125 can correct that output using the output generated by the non-causal filter 115. The output 130 of the post correction module 125 can represent the output of the atomic sensor 120 as if the environment noise was not present in the input 105. That is, the post correction module 125 mitigates or removes the effect of the environmental noise from the measurements generated by the atomic sensor 120.

For the case where the measurement device 100 is a gravimeter, it is not possible to distinguish gravitational acceleration from other inertial acceleration, like vibration. So the co-sensor 110 and atomic sensor 120 both measure the same signal of interest as well as the environmental noise (but with different bandwidths, with or without dead time, etc.). So when the co-sensor correction is subtracted from the atomic signal by the post-correction module 125, it removes the effect of noise as well as the co-sensor's measurement of gravity. So the resulting hybrid measurement is the difference between the gravity measured by the atomic sensor 120 and the co-sensor 110. Since the atomic sensor 120 is more accurate, this can be interpreted as a measurement of the co-sensor error and used as a further correction on the co-sensor signal. Thus, the output 130 of the post-correction module 125 can be used to perform a further correction to the un-filtered output of the co-sensor 110.

However, for other measurement devices 100, the co-sensor 110 can measure the environmental noise independent from the signal of interest, and then correct the atomic measurement from the effect of the environmental noise by subtracting the output of the non-causal filter 115 with the output of the atomic sensor 120.

While FIG. 1 illustrates a measurement device 100 with a non-causal filter 115, some implementation may require real-time processing. For example, the measurements generated by the measurement device 100 may be time sensitive. Although it may sacrifice precision, a matched, causal filter can be used in place of the non-causal filter 115. This may result in the environmental noise having more of an effect on the output 130 than if a non-causal filter 115 were used, but this represents a tradeoff with generating the output 130 in real time. Generating a matched filter for the measurement device 100, which may be causal or non-causal, is discussed later in FIG. 8.

Figure 2:
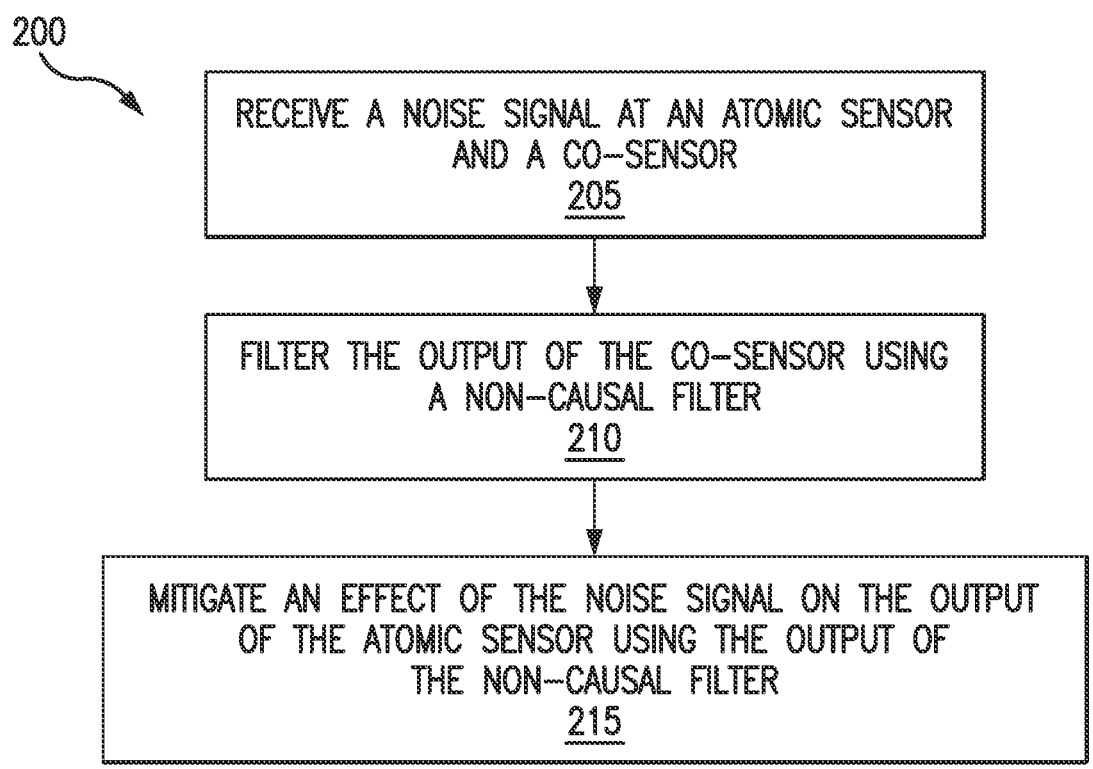
FIG. 2 is a flowchart for mitigating a noise component in the output of an atomic sensor using a co-sensor and a non-causal filter, according to one embodiment.

FIG. 2 is a flowchart of a method 200 for mitigating a noise component in the output of an atomic sensor using a co-sensor and a non-causal filter, according to one embodiment. At block 205, an atomic sensor and a co-sensor receive a noise signal (e.g., an environmental noise signal). In one embodiment, the sensors can receive an input signal that includes both a signal of interest (e.g., an acceleration, force, rotation, magnetic fields, or electric fields) along with the noise signal (e.g., vibration from engine noise). In one embodiment, the co-sensor and the atomic sensor are co-located in a platform, which can be a mobile or stationary platform, such that both sensors can measure or detect the noise component of the input signal. For example, the atomic sensor and the co-sensor may generate an output that is a combination of both the signal of interest (e.g., gravity, acceleration, rotation, etc.) and the noise signal. But in other embodiments, the output of the co-sensor may be a measurement of only the noise signal (e.g., only the environmental noise).

In one embodiment, the co-sensor and the atomic sensor are disposed in the same container or apparatus, but this is not a requirement. The co-sensor and the atomic sensor may be disposed in two different containers which are in the same platform and are communicatively coupled.

At block 210, a non-causal filter (e.g., the filter 115 in FIG. 1) filters the output of the co-sensor. In one embodiment, the output of the non-causal filter at any given time depends on outputs of the co-sensor that at least depend on future inputs, but can also depend on present and past inputs to the filter. As such, the outputs of the non-causal filter may be delayed relative to the outputs of the co-sensor. As a simplistic example, the co-sensor may provide outputs (e.g., measurements) at Times A, B, C, D to the non-causal filter. To generate a filtered output corresponding to the co-sensor's output at Time B, the non-causal filter may need to use the outputs of the co-sensor generated at Times A, B, and C. Thus, the non-causal filter outputs a filtered output at Time C (or later) that corresponds to the co-sensor's output at Time B. To generate a filter output corresponding to the co-sensor's output at Time C, the non-causal filter may need to use the outputs of the co-sensor at Times B, C, and D. Thus, the non-causal filter outputs a filtered output at Time D (or later) that corresponds to the co-sensor's output at Time C, and so forth.

At block 215, the post correction module (e.g., the post correction module 125 in FIG. 1) mitigates an effect of the noise signal on the output of the atomic sensor using the output of the non-causal filter. Using the filtered output can improve the noise rejection by several fold compared to sensor fusion solutions that do not use a matched filter or use only a causal filter. Further, the method 200 can increase the bandwidth of the correction to the full bandwidth of the co-sensor.

In one embodiment, the output of the filter is used to mitigate or remove the noise effects from the output of the atomic sensor. That is, because the filtered output accounts for the frequency dependent response of the co-sensor, it provides a more accurate representation of the noise in the environment. Thus, when the filtered output is subtracted from the output of the atomic sensor, the noise component in the atomic sensor is removed, leaving only the component corresponding to the signal of interest. In this manner, the method 200 improves on prior sensor fusion algorithms by using a non-causal filter to compensate for the signal delay and frequency dependent response of the co-sensor.

Figure 3:
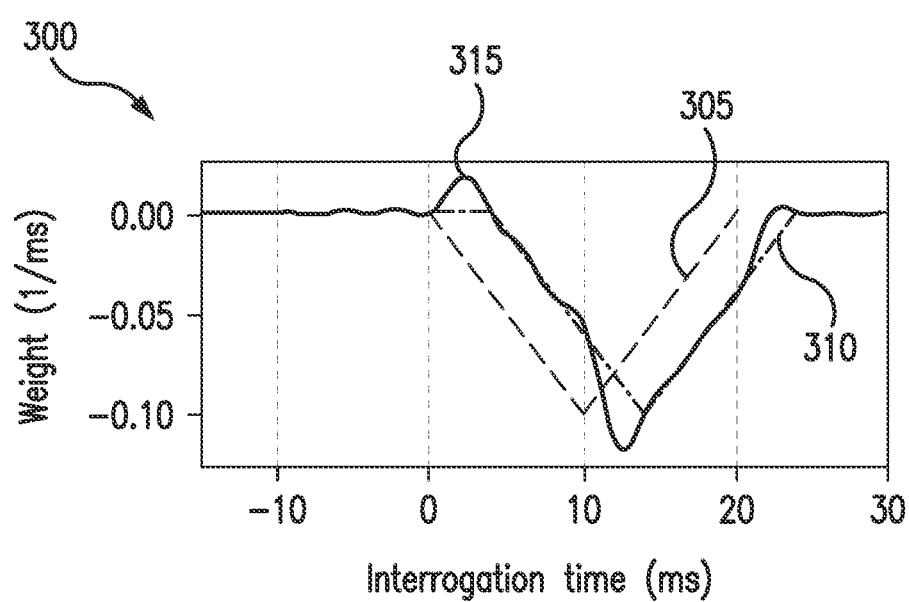
FIG. 3 is a graph illustrating some non-causal filters, according to one embodiment.

FIG. 3 is a graph 300 illustrating various causal and non-causal filters, according to one embodiment. The graph 300 includes three plots 305, 310, and 315. The plot 305 illustrates the ideal sensitivity function of an atomic sensor to the input over a time range (X-axis). This function is represented as a normalized temporal weight, and can be used as a FIR filter for the co-sensor signal (Y-axis). If the measurement device includes a perfect or ideal co-sensor, then its output weighted, or filtered, by this sensitivity function could be used to predict exactly the output of the atomic sensor. However, if there is some delay in the output of the co-sensor, this can be corrected by delaying the filter function 310, relative to the atomic sensitivity function 305, resulting in a non-causal filter. Thus, while the plot 310 corresponding to the co-sensor matches the plot 305 of the atomic sensor, it is shifted to the right because of the delay.

Furthermore, this co-sensor delay can vary depending on the frequency of each noise component, distorting the shape of the output signal. Thus, without compensating for the frequency dependent response in the co-sensor, the ability to use the output signal of the co-sensor to correct the output of the atomic sensor can vary widely depending on the frequency of the noise. This phase delay can be compensated using a matched filter function. In one embodiment, the non-causal filter is a finite impulse response (FIR) filter, shown in plot 315.

Figure 4:
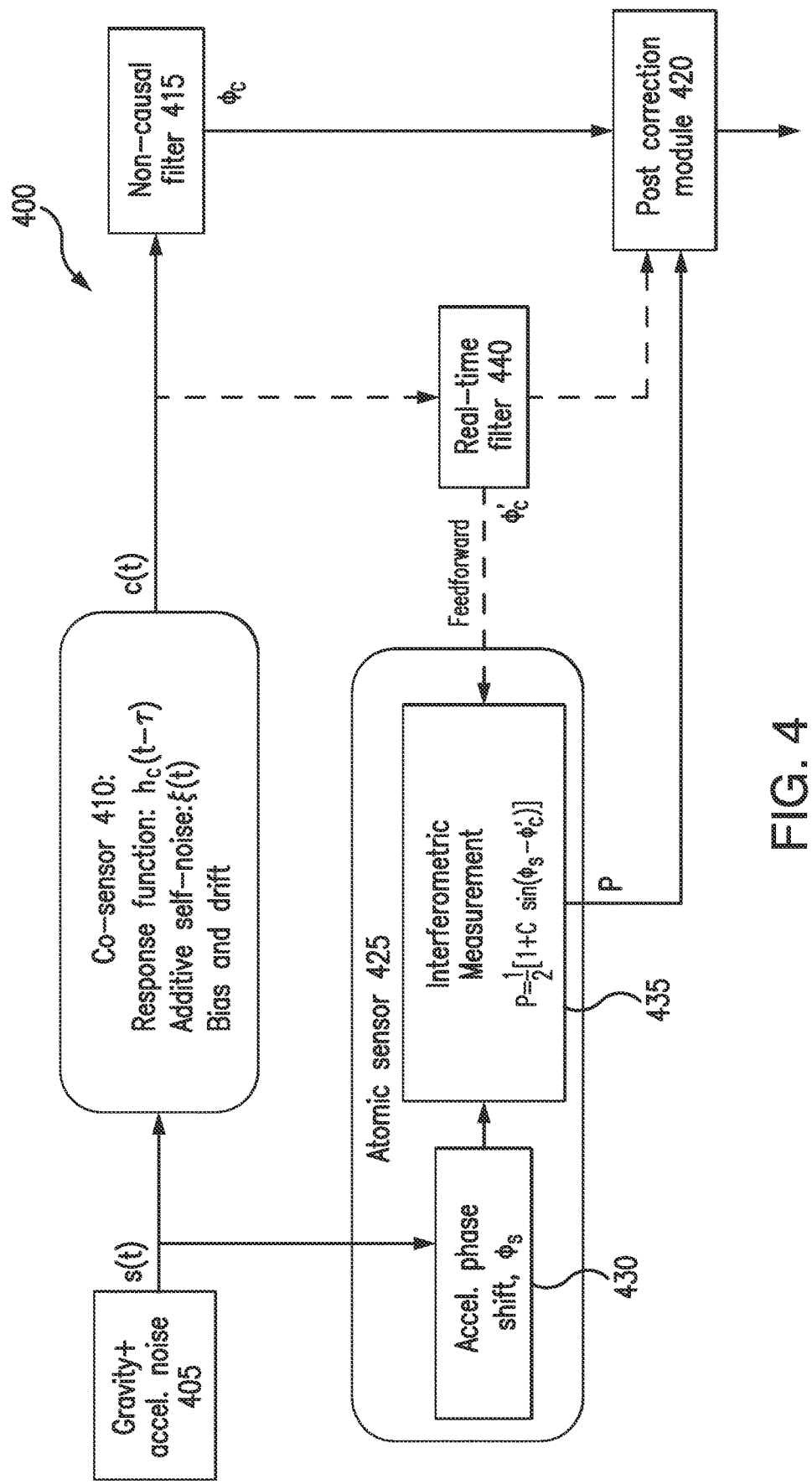
FIG. 4 illustrates a block diagram of gravimeter with an atomic sensor, a co-sensor, and a non-causal filter, according to one embodiment.

FIG. 4 illustrates a block diagram 400 of gravimeter with an atomic sensor 425, a co-sensor 410, and a non-causal filter 415, according to one embodiment. As shown, the co-sensor 410 and the atomic sensor 425 both receive, or are affected by, gravity (i.e., the signal of interest), in addition to acceleration noise 405 (s(t)). As discussed above, the acceleration noise may be unwanted environmental noise (e.g., engine vibration or seismic motion) that is different from the signal of interest (e.g., a local gravity measurement).

The co-sensor 410 has a response function characterizing the output of the co-sensor 410 in response to detecting the acceleration noise 405. In addition, real-life co-sensors 410 include self-noise (i.e., internal noise) introduced by components within the co-sensor 410 as well as bias and drift due to, for example, temperature fluctuations. The output signal of the co-sensor 410 (c(t)) is a combination of the transfer function, self-noise, and the bias and drift.

A real-time filter 440 receives the output of the co-sensor 410 and calculates (or predicts) the phase shift expected at the atomic sensor due to the acceleration noise 405. As shown, the output (OD) of the real-time filter 440 is fed-forward to the atomic sensor 425. Doing so enables real-time correction to mitigate the disturbance caused by the acceleration noise 405.

In addition to the real-time filter, the output of the co-sensor 410 is also provided to a non-causal filter 415. In one embodiment, the filter 415 is a non-causal FIR filter. As discussed above, the non-causal filter 415 can generate a filtered output of the co-sensor 410 that compensates for the frequency dependence and inherent signal delay in the response of the co-sensor 410. This filtered output is then provided to a post correction module 420 which can use the filtered output to perform post correction on the output of the atomic sensor 425. That is, FIG. 4 illustrates using both real-time correction via the co-sensor phase module 440 and the feedforward path as well as post correction of the output of the atomic sensor 425 using the non-causal filter 415 and the post correction module 420.

In one embodiment, the atomic sensor 425 includes an interferometer and a measurement module for generating a measurement. The gravity and acceleration noise 405 induce an acceleration phase shift 430 in an interferometric measurement result 435. The output (P) of the interferometric measurement 435 is determined by the interferometer contrast (C), the acceleration phase 430 ($\phi_s$) associated with the signal and noise 405, as well as, optionally, the real-time co-sensor phase correction provided by the real-time filter 440 ($\phi'_c$). The output of the atomic sensor 425 can then be transmitted to the post correction module 420 to perform additional correction.

While FIG. 4 illustrates a gravimeter that can perform both real-time and post correction on the measurements generated by the atomic sensor 425, in other embodiments only one type of correction may be performed. For example, the real-time filter 440 may be omitted so that only the post correction module 420 is used to correct the output of the atomic sensor 425. Further, the various modules in the gravimeter shown in FIG. 4 can include hardware, software, or combinations thereof in order to perform the recited functions.

Figure 5:
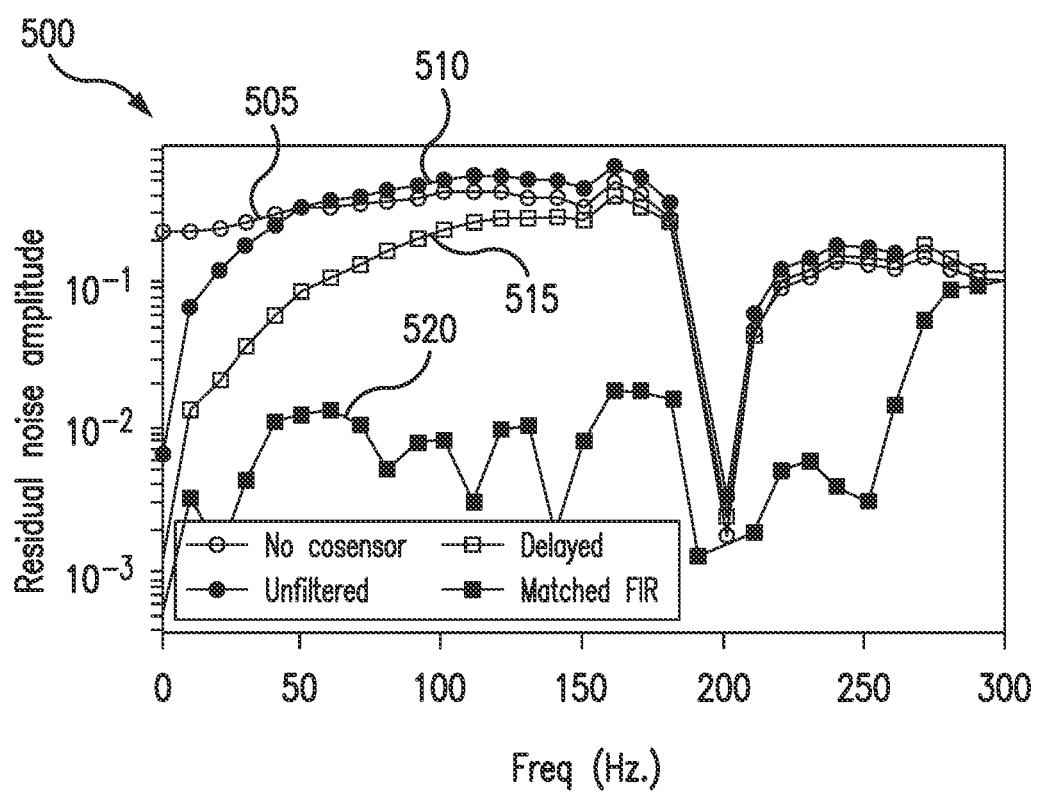
FIG. 5 illustrates data captured in the presence of noise at different frequencies, according to one embodiment.

FIG. 5 is a graph 500 illustrating measured data captured in the presence of noise at different frequencies, according to one embodiment. The X-axis of the graph 500 indicates a range of frequencies, while the Y-axis indicates the observed noise response amplitude at those frequencies. The plot 505 illustrates the response of an atomic gravimeter without any kind of sensor fusion (e.g., without using a co-sensor in the measurement device). The plots 510, 515, and 520 report the residual noise amplitude after sensor fusion between an atomic sensor and co-sensor, using different filter strategies.

The plot 510 reports the result obtained when the output of the co-sensor is directly integrated with atomic sensor sensitivity function (305), without use of either a non-causal or matched filter. Comparing plot 505 to plot 510 indicates some noise rejection is possible for lower frequencies (e.g., below 50 Hz) without filtering the co-sensor output, but there is little to no improvement for greater frequencies.

The plot 515 illustrates the response of performing sensor fusion while accounting for a fixed delay in the co-sensor response. For example, a simple non-causal FIR filter (310) may be used to filter the output of the co-sensor before it is fused with the output of the atomic sensor. Comparing plot 505 to 515 indicates some noise rejection is possible for some frequencies (e.g., below 150 Hz) but little to no improvement for greater frequencies.

The plot 520 illustrates the response of performing sensor fusion using a non-causal, matched FIR filter (e.g., the matched FIR filter represented by the plot 315 shown in FIG. 3) that compensates for the attenuation at any frequency and for any phase shift in the frequency of the co-sensor. Comparing plot 505 to plot 520 indicates noise rejection at almost all the frequencies on the X-axis. Thus, this filter provides rejection across a broader range by matching the co-sensor phase and amplitude response across the range of frequencies. This enables the measurement device to use the full bandwidth of the co-sensor to perform noise rejection.

Figure 6:
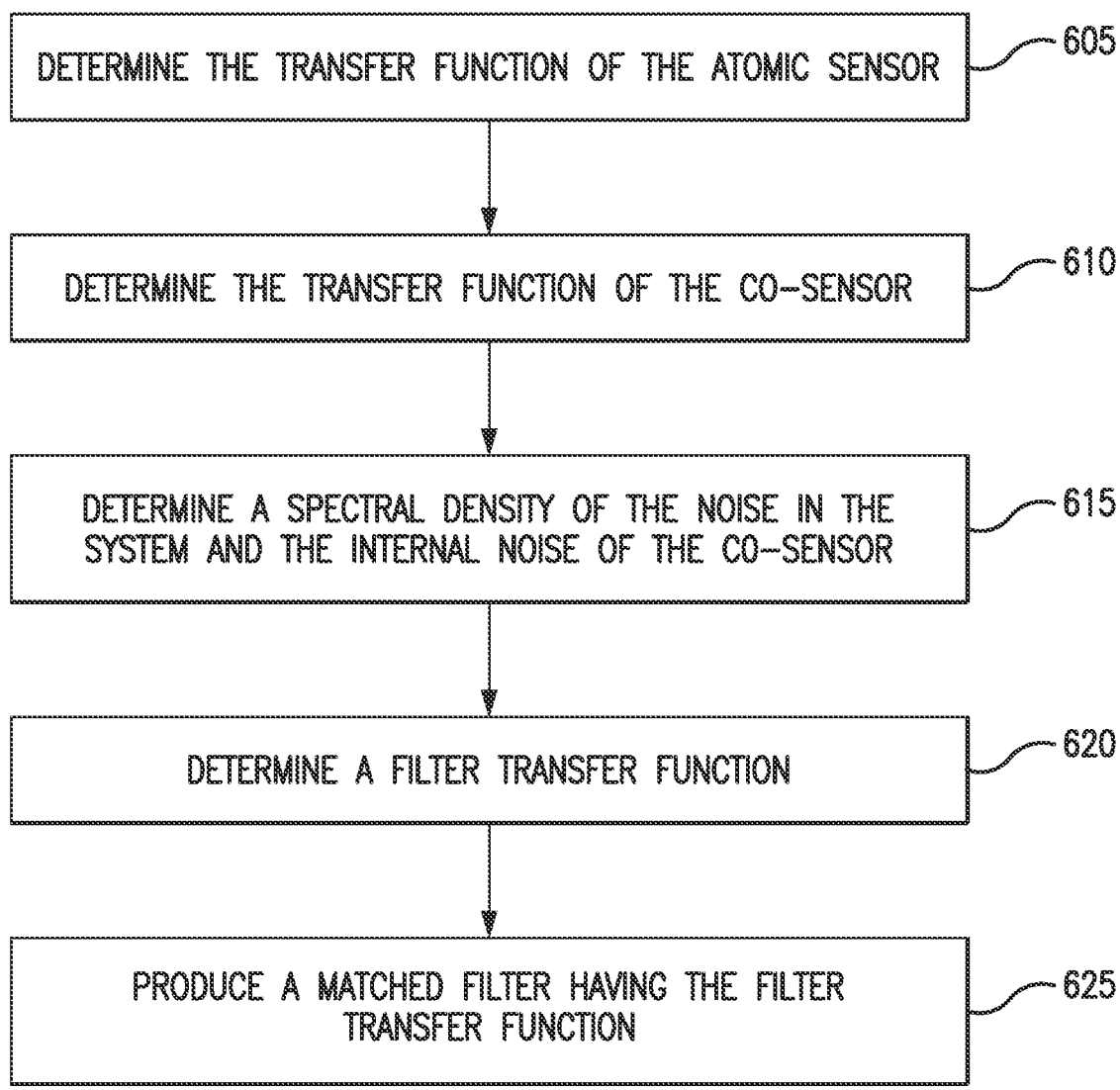
FIG. 6 is a flowchart for generating a matched filter, according to one embodiment.

FIG. 6 is a flowchart of a method 600 for generating a matched filter, according to one embodiment. Measurements performed using pulsed atom interferometers (e.g., pulsed atomic sensors) measure the phase shift induced on the sensor fringe by a time-dependent signal of interest s(t), such as inertial accelerations or rotations, and magnetic or electric fields. If the phase shift of the atom interferometer is linear in the quantity of interest, the total phase shift induced on each measurement by a signal $\phi_s$ can, in general, be written as a linear function of the signal of interest s(t) convolved with a temporal sensitivity function g(t) as shown in Equation 1.

$$\phi_s = \int_{-\infty}^{\infty} dt\, s(t) g(t) = \int_{-\infty}^{\infty} df\, s[f] g^*[f] \qquad (1)$$

Equation 1 indicates that the signal $\phi_s$ can alternately be expressed in the frequency domain in terms of the Fourier transform of the signal of interest—i.e., s[f]—and the interferometer transfer function g[f] (the Fourier transform of g(t)).

Assuming a co-sensor which is also linearly sensitive to the signal of interest s(t), a co-sensor signal c(t) can be modeled as the convolution of this signal with the cosensor's impulse response function $h_c(t)$ with additive, zero-mean, stationary self-noise $\xi(t)$ which is shown in Equation 2.

$$c(t) = \int_{-\infty}^{t} d\tau h_c(t-\tau)[s(\tau)+\xi(\tau)] \qquad (2)$$

The total interferometer phase $\phi_c$ induced by the signal of interest can then be estimated from the co-sensor signal c(t) by convolution with a general linear filter with impulse response function $h_f(t)$ according to Equation 2.

$$\phi_c = \int_{-\infty}^{\infty} dt h_f(t) c(t) \qquad (3)$$

An optimal filter impulse response function $h_f(t)$ minimizes the residual variance between the theoretical signal phase $\phi_s$ and the estimated cosensor phase $\phi_c$ which is expressed in Equation 4.

$$\langle \Delta\phi^2 \rangle = \langle (\phi_s - \phi_c)^2 \rangle \qquad (4)$$

This residual variance can be evaluated in the frequency domain, yielding Equation 5.

$$\langle \Delta\phi^2 \rangle = \int_{-\infty}^{\infty} df (|g[f] - h_f[f] h_c[f]|^2 S_s[f] + |h_f[f] h_c[f]|^2 S_c[f]) \qquad (5)$$

In Equation 5, $h_f[f]$ and $h_c[f]$ are the Fourier transforms of the filter and co-sensor impulse-response functions, respectively. $S_s[f] = \langle |s[f]|^2 \rangle - |\langle s[f] \rangle|^2$ is the expected signal noise spectral density and $S_c[f] = \langle |\xi[f]|^2 \rangle$ is the cosensor's intrinsic self-noise spectral density.

The optimal filter transfer function can be derived by functional minimization of Equation 5, yielding Equation 6.

$$h_f[f] = \frac{g[f]}{h_C[f]} \frac{S_S[f]}{S_S[f] + S_C[f]} \qquad (6)$$

Equation 6 indicates that the amplitude and phase of the optimal filter transfer function $h_f[f]$ is given by the ratio of the complex-valued interferometer (e.g., the atomic sensor) and co-sensor transfer functions g[f] and $h_c[f]$, weighted by the expected signal to noise ratio at each frequency component.

Given Equation 6, the method 600 describes techniques for determining the optimal transfer function $h_f[f]$ to generate a matched filter. At block 605, a designer or a filter design application (e.g., a software application) determines the transfer function of the atomic sensor. That is, the designer determines the temporal sensitivity function g(t) of the atomic sensor which is then transformed into g[f] using a Fourier transform. The temporal sensitivity function g(t) may be determined theoretically, obtained through testing, or may be provided by the manufacturer of the atomic sensor.

At block 610, the designer or filter design application determines the transfer function of the co-sensor. That is, the designer determines the impulse-response function $h_c(t)$ of the co-sensor which is then transformed into $h_c[f]$ using a Fourier transform. The impulse-response function $h_c(t)$ of the co-sensor may be obtained through testing or may be provided by the manufacturer of the co-sensor.

At block 615, the designer or filter design application determines a spectral density $S_s[f]$ of the expected noise in the system and the internal noise of the co-sensor $S_c[f]$. For example, the spectral noise density of the system may be the expected vibrational noise from a large engine that will be near the measurement device when deployed. In general, the spectral noise density can be derived from any knowledge of the environmental noise at the platform in which the measurement device will be deployed. The internal noise of the co-sensor may be provided by the manufacturer or can be measured.

At block 620, the designer or filter design application determines a filter transfer function using the transfer functions of the atomic sensor and the co-sensor, the spectral density of the noise in the system, and the internal noise of the co-sensor. That is, after performing blocks 605-615, the designer now has all the variables in Equation 6—i.e., $h_c[f]$, G[f], $S_s[f]$, and $S_c[f]$. As such, the Equation 6 can be solved to determine the filter transfer function $h_f[f]$.

At block 625, a manufacture can produce a matched filter that has the filter transfer function. That is, the matched filter is designed for the specific atomic sensor and co-sensor being used. As such, the matched filter can compensate for the non-linear phase dispersion of the co-sensor as discussed above. This matched filter can be a distinct component (or combination of components) that is disposed in a measurement device. The matched filter can be implemented directly with electronic circuitry, in an FPGA, in firmware on a microprocessor, or in software executing on a CPU. In one embodiment, when the matched filter is implemented as a FIR filter the filter coefficients are determined by the inverse Fourier transform of the filter transfer function, $h_f[f]$.

In one embodiment, the matched filter is non-causal. That is, determining a filter transfer function using method 600 results in a non-causal filter, which is due to the fact the non-linear phase dispersion of the co-sensor can cause a variable delay in its output. Thus, in many, if not all applications, the most optimal matched filter will be a non-causal filter.

However, the method 600 can be modified to generate a matched filter that is causal. For example, the method 600 can use an additional constraint that the matched filter has to provide an output that can be used in real-time to correct the output of the atomic sensor. This may be done if the measurement device is being used in a time sensitive application. Doing so represents a tradeoff in the accuracy of the measurements generated by the measurement device with the ability to output the measurements in real time. In any case, using the method 600 to generate a matched, causal filter still results in an improvement in the accuracy of the measurement device relative to prior solutions.

Further, the method 600 can be used if the expected signal noise spectral density $S_s[f]$ of the environmental noise is not known. That is, the designer may not know where or how the measurement device will be deployed, and thus, does not know the spectral density $S_s[f]$ of the noise in the system at block 615. In that case, an optimal un-biased filter can be derived by assuming arbitrarily large amount of environmental noise, taking the limit $S_s[f] \to \infty$ in the result shown in Equation 6 to result in Equation 7.

$$h_f[f] = \frac{G[f]}{h_C[f]} h_{limit}[f] \qquad (7)$$

Equation 7 illustrates that the filter transfer function can still be found by identifying the ratio between the Fourier transform of the temporal sensitivity function of the atomic sensor G[f] and the impulse-response function $h_c[f]$ of the co-sensor. In practice, if the co-sensor response $h_c[f]$ approaches zero for some frequencies, for best performance it might be necessary to include an additional frequency limiting factor $h_{limit}[f]$, to avoid singularities in Equation 7.

Figure 7:
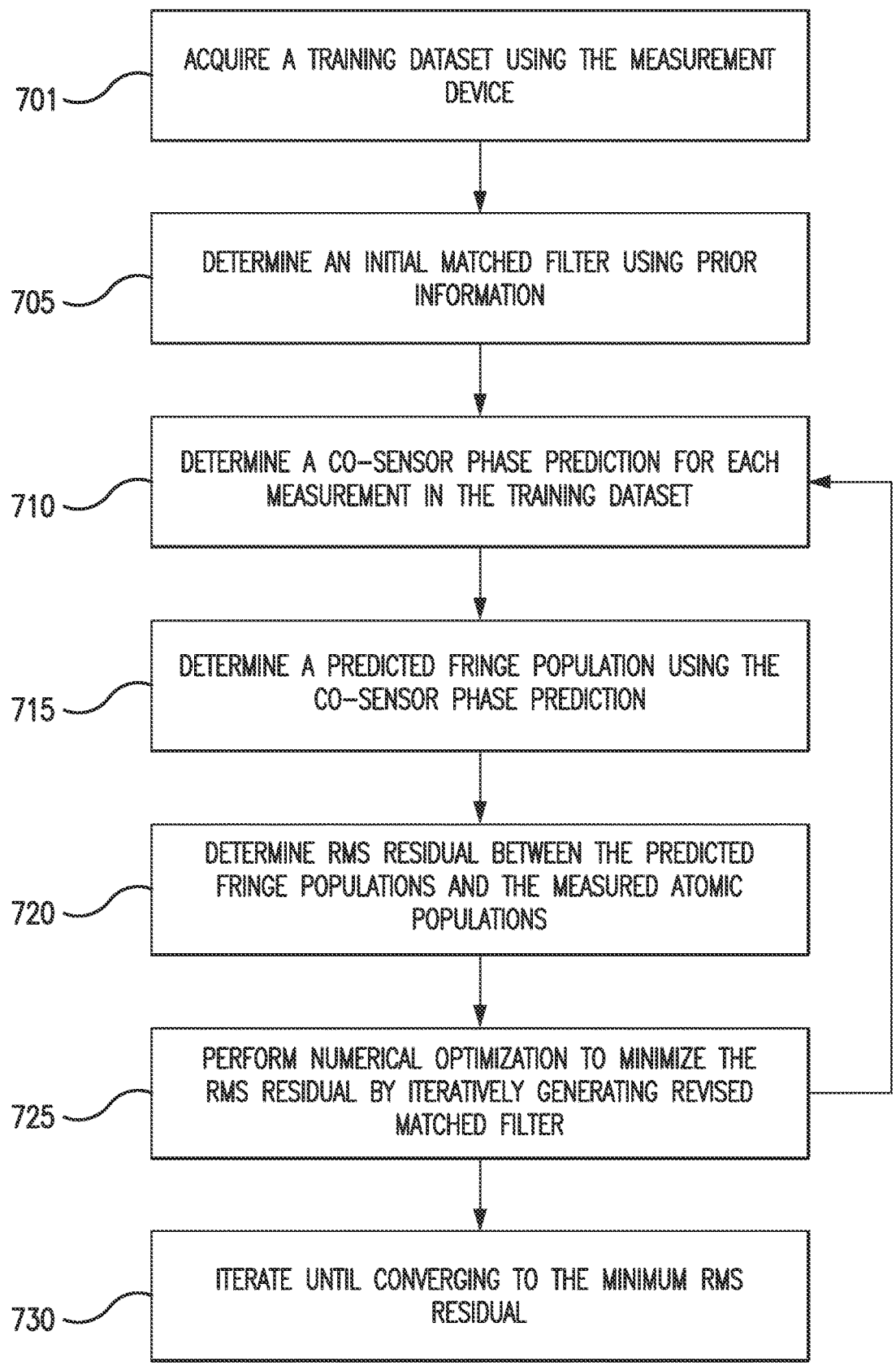
FIG. 7 is a flowchart for generating a matched filter, according to one embodiment

FIG. 7 is a flowchart of a method 700 for generating a matched filter, according to one embodiment. In the method 700, an optimal matched filter response function $h_f[t]$ is estimated by numerical optimization or machine learning methods from a training set of recorded measurements. This method 700 allows approximation of an optimal filter without reliable prior information about the individual sensor transfer functions or environmental noise spectrum.

This numerical optimization method 700 also creates the opportunity for 'in the field' optimization to a particular noise environment, without the need for additional test equipment. A set of previously recorded data can be used as the training set to determine an optimized filter for subsequent measurements in the same environment. This optimization can be repeated periodically, using the most recent set of recorded measurements for 'on-line' re-optimization of the co-sensor filter.

The method 700 minimizes the objective function in Equation 4 by determining the best co-sensor phase prediction $\phi_c$ for the signal-induced phase $\phi_s$ from the observed co-sensor signal c(t). However, for an interferometric sensor such as the atomic gravimeter, the atomic sensor measurement output may not be directly proportional to the signal phase. The measured value is the fringe population as expressed in Equation 8:

$$P = A[1 - C\cos(\phi_s + \phi_0 + \delta\phi)] + \delta P \quad (8)$$

which is a sinusoidal function of the phase, where A is the average fringe offset, C is the unit-less fringe contrast, $\phi_0$ is the configured measurement phase, and $\delta\phi$ and $\delta P$ represent residual phase noise and population noise, respectively.

The optimization problem can then be reformulated as a minimization of the predicted and observed fringe populations. To do so, at block 701 the designer or filter design application acquires a training dataset with the measurement device in a representative noisy environment by performing a sequence of measurements with the atomic sensor, simultaneously recording the atomic sensor outputs, P, and the corresponding digitized co-sensor signal $c_i = c(t_i)$ sampled at times $t_i = i\,\delta t$.

At block 705, an initial filter is determined using the best available prior information to be used as a starting point for further numerical optimization. In one embodiment, this initial filter is determined using method 600.

At block 710, the designer or filter design application determines the co-sensor phase prediction $\phi_c$ for each measurement in the training dataset using the current choice of filter response function $f_i = h_f(t_i)$, sampled at times $t_i$ as shown in Equation 9:

$$\phi_c = \Sigma_i f_i c_i \delta t \quad (9)$$

At block 715, the designer or filter design application determines a predicted fringe population using the co-sensor phase prediction, and estimated contrast C' and offset A' according to the following:

$$P' = A'[1 - C'\cos(\phi_c + \phi_0)] \quad (10)$$

At block 720, the designer or filter design application determines a root mean square (RMS) fringe residual between the predicted fringe populations to the measured atomic populations described in Equation 8. In one embodiment, the RMS residual is determined between measurement predictions determined from the co-sensor and measurements obtained from the atomic sensor. In one embodiment, the RMS fringe is determined over the full training set of atomic sensor and co-sensor measurements. The RMS residual can by as expressed as the following:

$$\langle \Delta P^2[A', C', f_i] \rangle = \langle (P - P')^2 \rangle \quad (11)$$

At block 725, the designer or filter design application performs numerical optimization using the RMS residual to generate a matched filter. In one embodiment, the RMS residual defines the objective function for the numerical optimization algorithm, where the filter weights $f_i$, fringe offset A', and contrast C' are the optimization parameters which are iteratively chosen to minimize the residual RMS $\langle \Delta P^2 \rangle$. At block 730, the optimal matched filter is found when iteration converges to the minimum RMS residual.

In one embodiment, if the interferometer measurements uniformly sample the full interferometer fringe, then the fringe offset A' and contrast C' can be estimated directly from the distribution of observed populations P, reducing the optimization to a function of the filter weights $f_i$ only.

In one embodiment, due to the potentially large number of optimization parameters and the inherently stochastic nature of the residual fringe phase noise $\delta\phi$ and population noise $\delta P$ in the atomic measurement, stochastic optimization algorithms, such as differential evolution or particle swarm optimization, may be particularly well suited for minimizing this objective function.

Figure 8:
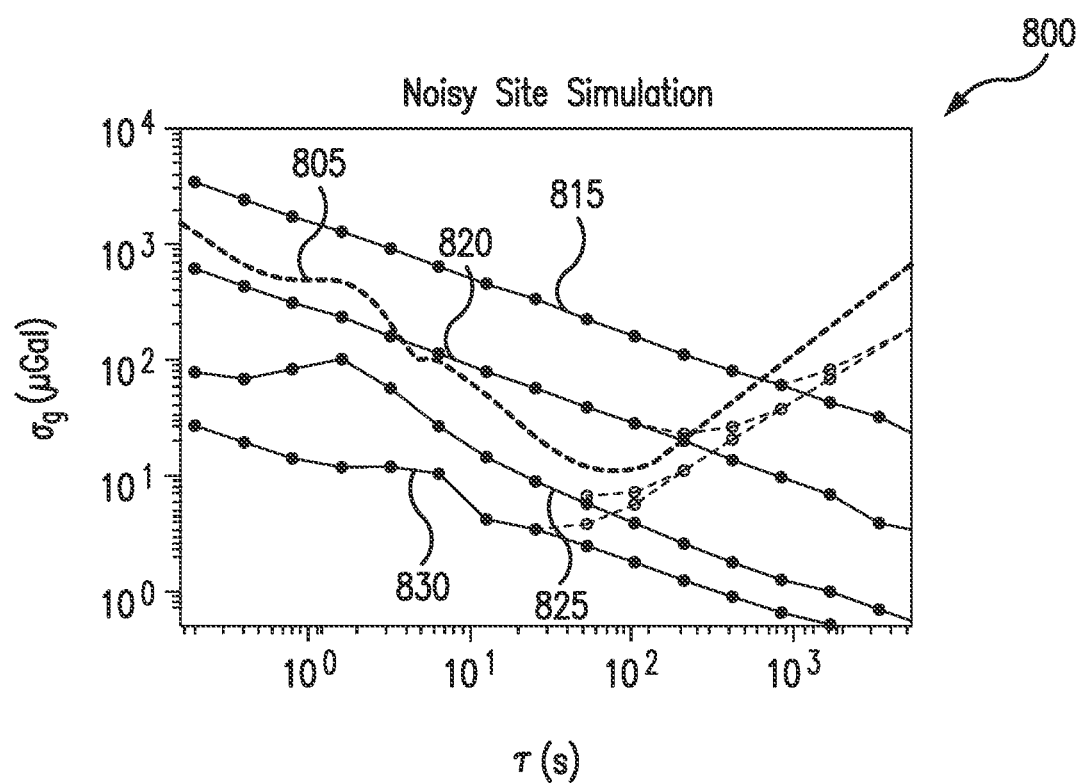
FIG. 8 is a graph comparing simulated measurement performance with and without using co-sensor corrections and/or a matched filter, according to one embodiment.

FIG. 8 is a graph 800 comparing the simulated measurement imprecision vs. averaging time, or Allan deviation, of a pulsed atomic sensor for measurement devices with or without co-sensor corrections, non-causal filtering, or a matched non-causal filter, according to one embodiment. The plot 805 illustrates the simulated seismic noise (e.g., environmental noise) added to the input signal, as it would be observed by a theoretical, ideal co-sensor.

The plot 815 illustrates the measurements captured by a pulsed atomic measurement device without any co-sensor correction (e.g., does not use the output of the co-sensor to correct for noise in the atomic sensor).

The plot 820 illustrates the measurements captured by a measurement device that uses co-sensor fusion without filtering. That is, the output of the co-sensor is directly integrated with the atomic sensor sensitivity function (shown as plot 305 in FIG. 3) without additional filtering. In one embodiment, a causal filter is used. Thus, noise correction can be performed in real-time, although the results may not provide as precise of a match when compared to using a non-causal filter as shown in the last two plots.

The plot 825 illustrates the measurements captured by a measurement device that uses sensor fusion with a delayed, non-causal filter to filter the output of the co-sensor. The plot 830 illustrates using a non-causal matched FIR filter with 20 second duration. As shown, using a non-causal filter, and especially a matched FIR filter, generate results where the matched filter performs approximately three times better than the non-matched filter.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As will be appreciated by one skilled in the art, the embodiments disclosed herein may be embodied as a system, method, or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more."Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A measurement device, comprising:
   an atomic sensor;
   a non-atomic co-sensor; and
   a matched, non-causal filter coupled to an output of the co-sensor and configured to generate a filtered output, wherein the measurement device is configured to mitigate a noise component in an output of the atomic sensor based on the filtered output of the matched non-causal filter, wherein the matched non-causal filter is derived from transfer functions of the co-sensor and the atomic sensor.

2. The measurement device of claim 1, wherein the atomic sensor is a cold atomic sensor.

3. The measurement device of claim 2, wherein the atomic sensor is configured to, during operation, experience downtime during which atoms are trapped into an atom cloud in the atomic sensor and then cooled before the atom cloud is dropped in the atomic sensor.

4. The measurement device of claim 1, further comprising:
   a post-correction module configured to use the filtered output to perform post-correction on the output of the atomic sensor.

5. The measurement device of claim 1, wherein the matched non-causal filter uses future inputs received from the co-sensor to generate an output for a given time.

6. The measurement device of claim 1, wherein the matched non-causal filter is a finite impulse response (FIR) filter.

7. The measurement device of claim 1, wherein the matched non-causal filter compensates for a frequency dependent response of the co-sensor where outputs generated by the co-sensor have at least one of frequency-dependent phase delay or attenuation for each frequency component of the environmental noise.

8. A method, comprising:
   receiving a noise signal at an atomic sensor and a non-atomic co-sensor;
   filtering an output of the co-sensor using a matched non-causal filter; and
   mitigating an effect of the noise signal on an output of the atomic sensor using an output of the matched non-causal filter, wherein the matched non-causal filter is derived from transfer functions of the co-sensor and the atomic sensor.

9. The method of claim 8, wherein the atomic sensor is a cold atomic sensor.

10. The method of claim 8, further comprising:
    trapping a cluster of atoms into an atom cloud in the atomic sensor;
    cooling the atoms in the atom cloud; and
    dropping the atom cloud and measuring its acceleration.

11. The method of claim 8, wherein mitigating the effect of the noise signal on the output of the atomic sensor using an output of the matched non-causal filter comprises:
    performing post-correction on the output of the atomic sensor using the output of the matched non-causal filter.

12. The method of claim 8, wherein the matched non-causal filter uses future inputs received from the co-sensor to generate an output for a given time.

13. The method of claim 8, wherein the matched non-causal filter is a FIR filter.

14. The method of claim 8, wherein filtering the output of the co-sensor using the matched non-causal filter further comprises:
    compensating for a frequency dependent response of the co-sensor where outputs generated by the co-sensor have at least one of frequency dependent phase delay or attenuation for each frequency component of the environmental noise.

15. A method, comprising:
    determining a transfer function of an atomic sensor;
    determining a transfer function of a non-atomic co-sensor, wherein the atomic sensor and the non-atomic co-sensor are part of a measurement device;
    determining a filter transfer function based on the transfer functions of the atomic sensor and the co-sensor;
    producing a matched, non-causal filter for the measurement device based on the filter transfer function, wherein the matched, non-causal filter is coupled to an output of the co-sensor; and
    mitigating a noise component in an output of the atomic sensor based on a filtered output of the matched non-causal filter.

16. The method of claim 15, further comprising:
    determining a spectral density of expected noise in an environment in which the measurement device is expected to be deployed;
    determining an internal noise of the co-sensor; and
    determining the filter transfer function based on the spectral density of expected noise and the internal noise of the co-sensor, in addition to the transfer functions of the atomic sensor and the co-sensor.

17. The method of claim 15, wherein the matched, non-causal filter uses future inputs received from the co-sensor to generate an output for a given time.

18. The method of claim 17, wherein the matched non-causal filter is a FIR filter.

19. The method of claim 15 the atomic sensor is a cold atomic sensor that, during operation, experiences downtime during which atoms are trapped into an atom cloud in the atomic sensor and then cooled before the atom cloud is dropped in the atomic sensor.

* * * * *